United States Patent
Miao

(10) Patent No.: US 7,868,658 B1
(45) Date of Patent: Jan. 11, 2011

(54) LEVEL SHIFTER CIRCUITS AND METHODS FOR MAINTAINING DUTY CYCLE

(75) Inventor: Xiao Yu Miao, Singapore (SG)

(73) Assignee: Marvell International Ltd., Hamilton (BM)

( * ) Notice: Subject to any disclaimer, the term of this patent is extended or adjusted under 35 U.S.C. 154(b) by 40 days.

(21) Appl. No.: 12/350,172

(22) Filed: Jan. 7, 2009

Related U.S. Application Data

(60) Provisional application No. 61/020,437, filed on Jan. 11, 2008.

(51) Int. Cl.
*H03K 19/094* (2006.01)
*H03K 19/0175* (2006.01)

(52) U.S. Cl. .......................... 326/68; 326/86; 327/175; 327/333

(58) Field of Classification Search ................. 326/23, 326/27, 68, 86; 327/175, 108, 333
See application file for complete search history.

(56) References Cited

U.S. PATENT DOCUMENTS

| | | | |
|---|---|---|---|
| 4,903,237 A | 2/1990 | Ro | |
| RE34,808 E | 12/1994 | Hsieh | |
| 5,391,939 A * | 2/1995 | Nonaka | 326/83 |
| 7,199,617 B1 | 4/2007 | Schrom et al. | |
| 7,348,800 B2 | 3/2008 | Koto et al. | |
| 7,348,801 B2 | 3/2008 | Nojiri | |

OTHER PUBLICATIONS

Behnam Amelifard et al, "Enhancing the Efficiency of Cluster Voltage Scaling Technique for Low-power Application", ISCAS 2005 IEEE International Symposium on Circuits and Systems, May 23-26, 2005, Kobe, Japan.

* cited by examiner

*Primary Examiner*—Daniel D Chang

(57) ABSTRACT

A circuit comprises first and second buffers, and an output buffer. The first buffer receives an input signal and provides a first buffer output signal on a first lead. The second buffer receives the input signal and provides a second buffer output signal on a second output lead. The output buffer has a first input lead coupled to the first output lead and AC coupled to the second output lead. The AC coupling communicates timing information from the second buffer to the output buffer. The first buffer applies sufficient voltage to control the first input lead of the output buffer under DC conditions.

21 Claims, 7 Drawing Sheets

302

US 7,868,658 B1

LEVEL SHIFTER CIRCUITS AND METHODS FOR MAINTAINING DUTY CYCLE

CROSS REFERENCE TO RELATED APPLICATIONS

This application claims the benefit of priority from U.S. Provisional Patent Application No. 61/020,437, filed Jan. 11, 2008, entitled "Low Power, High Speed, Duty Cycle Keeping, CMOS Level Shifter" the entire disclosure of which is hereby incorporated herein by reference.

BACKGROUND

The present invention relates to level shifting, and in particular, to level shifter circuits and methods for maintaining duty cycle in level shift circuits.

Modern electronic systems comprise a wide variety of digital devices for processing, transmitting and/or storing digital data. Processing, transmitting and storing digital data often depends on the timing of a clock and/or other signals. The quality of the clock source limits the performance possible for a digital electronic system. For example, the reliability of the timing of electronic gates and clocks within the system affect the time a system must wait (e.g. set up and hold times) to latch the data at an input terminal or to perform other functions with that data. The more unreliable the transition timing of the clock signal, the longer the setup and hold times required by the system, and the poorer the system performance.

Often, different portions of an electronic system use different digital rail voltage values. For example, it is known in the art to have digital integrated circuits that use one set of rail voltage values internally (e.g., 0 and 1.8 volts for the digital zero and one values), and another set of rail voltage values to drive output pins (e.g. 0 and 5 volts for the digital zero and one values). Similarly, is known to have a system which uses lower voltage rails for one group of circuits, but uses higher voltage rails to drive a set of cables, or to use lower voltage rail values for reading data from memory cells, while using higher voltage rail values to drive circuitry external to those memory cells (see U.S. Pat. No. 4,903,327, issued to Rao). See also U.S. Pat. No. Re. 34,808, issued to Hsieh, which discusses circuitry for converting signals using TTL voltage levels to different voltage levels.

FIG. 1 illustrates a prior art CMOS level shifter circuit 100. Level shifter circuit 100 includes an inverter 101 coupled to a control terminal of a transistor 102. Level shifter circuit 100 utilizes a voltage range from ground to $V_{D0}$ at an input terminal 104 and a voltage range from ground to $V_{D1}$ at an output terminal 105. Voltage $V_{D1}$ is greater than voltage $V_{D0}$. Unfortunately, there is a mismatch between the timing characteristics of input signal $CLK_{in}$ and output signal $CLK_{out}$. This is because when transistor 102 turns off, the rise time of signal $CLK_{out}$ is slowed by the output impedance of circuit 100 (depending primarily upon the effect of resistor R and the capacitance (not shown) on output terminal 105. In contrast, when signal $CLK_{out}$ falls, the output impedance is dominated by the on-resistance of transistor 102 (much lower than resistor R) and the above-mentioned capacitance. This mismatch of impedance skews transitions of output signal $CLK_{out}$ such that the duty cycle for output signal $CLK_{out}$ does not match the duty cycle of input signal $CLK_{in}$.

FIG. 2 illustrates a prior art CMOS level shifter circuit 200. Level shifter circuit 200 includes transistors 201-204. Differential input signals $CLK_{in+}$ and $CLK_{in-}$ drive the control input terminals of transistor 203 and 204, respectively. Transistors 201 and 202 are in a cross coupled configuration. When transistor 203 is switched on, the current passing through transistor 203 must overcome the current passing through transistor 201 in order to switch the level shifter output ($CLK_{out-}$) to a low level. This delays and changes the timing of the rising and falling transitions of the output signals $CLK_{out+}$ and $CLK_{out-}$ and skews the duty cycle.

The current passing through transistor 203 must overcome the current passing through the transistor 201 in order to switch the level shifter output (CLKout−) to a low level. A weaker drive for transistor 201 will improve the fall time of signal and degrade the rise time performance at the same time. Changes in supply voltage (Vdd2) may change the drive of transistor 201(/202) which may change the output rising(/falling) edges. Inconsistent rising (/falling) edges may degrade duty cycle performance.

Thus, there is a need for improved level shifting. A level shifter circuit in accordance with one embodiment of the present invention solves these and other problems by providing level shifter circuits and methods for maintaining duty cycle.

SUMMARY

A circuit according to one embodiment the present invention includes a first buffer, a second buffer, and an output buffer. The first buffer receives an input signal and provides a first buffer output signal on a first output lead. The second buffer receives the input signal and provides a second buffer output signal on a second output lead. The output buffer has a first input lead coupled to the first output lead and AC coupled to the second output lead. The AC coupling communicates timing information from the second buffer to the output buffer. The first buffer applies sufficient voltage to control the first input lead of the output buffer under DC conditions.

Typically, the first buffer has a higher output impedance than the second buffer so that changes in state of the second buffer output signal are communicated to the first input lead of the output buffer.

The output buffer typically comprises a first switch having a control lead coupled to the first input lead of the output buffer and a second switch having a control lead coupled to a second input lead of the output buffer. The first and second switches are coupled in series across a voltage supply. The output buffer has an output lead coupled to a node between the switches.

In one embodiment, the second input lead of the output buffer is coupled to the second output lead. In an alternative embodiment, the circuit comprises a third buffer that receives the input signal and provides a third output signal on a third output lead. The third output lead is coupled to the second input lead of the output buffer.

Typically, the input signal has a set of input voltage rail values. The output buffer provides an output signal having a set of output voltage rail values having a greater voltage swing than the voltage swing of the input voltage rail values. The first buffer ensures that the signal on the input lead of the output buffer achieves a sufficient voltage under DC conditions to properly operate the output buffer. The second buffer ensures the input lead of the output buffer achieves a sufficient voltage under AC conditions to properly operate the output buffer.

A circuit in accordance with another embodiment comprises first, second, and third buffers. The first buffer receives an input signal and provides a first buffer output signal having first voltage rail values. The second buffer receives the input signal and provides a second buffer output signal having second voltage rail values. The third buffer is coupled to receive the first output signal on a first input terminal and coupled to receive the second buffer output signal on a second input terminal and provides a third buffer output signal having third voltage rail values. The third buffer voltage rails have a range greater than both a range of the first voltage rail values and a range of the second voltage rail values. The second buffer output signal provides signal transitions at the first and second input terminals of the third buffer such that the third buffer maintains transition timing relationships of the input signal.

In another embodiment, the transition timing relationship includes a duty cycle of the input signal.

The circuit typically further comprises a capacitor coupled between the first input terminal of the third buffer and the second input terminal of the third buffer. The capacitor AC couples the second buffer output signal to the first input terminal of the third buffer.

In one embodiment, the range of the first voltage rails allows the second voltage rail values of the second buffer output signal to contribute to a change of state of the third buffer output signal according to the transition timing relationship.

In one embodiment, the second buffer has a lower output impedance than the first buffer. Thus, the second output signal changes a state of the first input terminal of the third buffer. The first buffer maintains the state of the signal on the third buffer input terminal when the AC coupling of the second output signal decays.

In another embodiment, the circuit further comprises a fourth buffer. The fourth buffer receives an input signal and provides a fourth buffer output signal having fourth voltage rail values. The third buffer voltage rails have a range greater than a range of the fourth voltage rail values. The output lead of the fourth buffer is coupled to the second input terminal of the output buffer. The output lead of the second buffer is AC coupled to the second input terminal of the output buffer.

The circuit typically further comprises first and second capacitors. The first capacitor AC couples the first input terminal of the third buffer to the output terminal of the second buffer. The second capacitor AC couples second input terminal of the third buffer and the output terminal of the second buffer.

The range of the first voltage rail values typically allows the second voltage rail values of the second buffer output signal to contribute to a change of state of the third buffer output signal according to the transition timing relationship. The range of the fourth voltage rail values typically allows the second voltage rail values of the second buffer output signal to contribute to a change of state of the third buffer output signal according to the transition timing relationship.

The output impedance of the second buffer is typically lower than the output impedance of the first and fourth buffers. This enables the second buffer to change a state of the third buffer output signal due to AC coupling of the second buffer to the output buffer. The first and fourth buffers maintain the state of the third buffer output signal when the AC coupled signal delays.

The third buffer typically includes a high side switch and a low side switch. The high side switch has a first terminal coupled to a first reference voltage, a second terminal coupled to an output terminal, and a control terminal coupled to the first input terminal of the third buffer. The low side switch has a first terminal coupled to the output terminal, a second terminal coupled to a second reference voltage, and a control terminal coupled to the second input terminal of the third buffer. The first and second reference voltages provide the third voltage rail values.

In one embodiment, an integrated circuit or other electrical system comprises the circuit in accordance with the invention. A first portion of the integrated circuit (or other electrical system) uses one set of voltage rail values to communicate a signal, and the circuit in accordance with the invention drives another portion of the integrated circuit (or system) with a signal having second voltage rail values. Alternatively, the circuit in accordance with the invention drives output terminals, pins or cables with the second voltage rail values. The circuit in accordance with the invention may be used in any systems with multiple supply voltages like hard disk drives (HDD), digital video disk players (DVD), high definition televisions (HDTV), and microelectomechanical systems (MEMS).

A method in accordance with another embodiment of the invention comprises receiving an input signal and generating in response thereto first and second buffered output signals. The second buffered output signal communicates timing information from the second buffer output signal to a first input lead of the output buffer via AC coupling. The first buffer output signal is provided to and has sufficient voltage to control the first input lead of the output buffer under DC conditions.

Typically, the first buffer output signal does not interfere with changes in a state of the second output buffer signal that are communicated to the first input lead of the output buffer.

In one embodiment, the method further comprises switching a first switch according to a signal on the first input lead of the output buffer and switching a second switch according to the second output signal. The first switch couples a first reference voltage to an output terminal of the output buffer when the output buffer is in one state. The second switch couples a second reference voltage to the output terminal of the output buffer when the output buffer is in another state.

In another embodiment, the method further comprises buffering the input signal to generate and couple a third output signal to a second input lead of the output buffer. The first switch is switched according to a first signal on the input lead of the output buffer. The second switch is switched according to a second signal on the second input lead of the output buffer. The first switch comprises a first reference voltage to an output terminal of the output buffer. The second switch couples a second reference voltage to the output terminal of the output buffer.

In another embodiment, the input signal has a set of input voltage rail values. The output buffer provides an output signal having a set of output voltage rail values having a greater voltage swing than the voltage swing of the input voltage rail values. The first buffer output signal has a sufficient voltage under DC conditions to properly operate the output buffer. The second buffer output signal has a sufficient voltage under AC conditions to properly operate the output buffer.

DETAILED DESCRIPTION

Described herein are level shifter circuits and methods for maintaining duty cycles. In the following description, for purposes of explanation, examples and specific details are set forth in order to provide a thorough understanding of the present invention. It will be evident, however, to one skilled in the art that the present invention as defined by the claims may include some or all of the features in these examples alone or in combination with other features described below, and may further include modifications of the features and concepts described herein.

Figure 1:
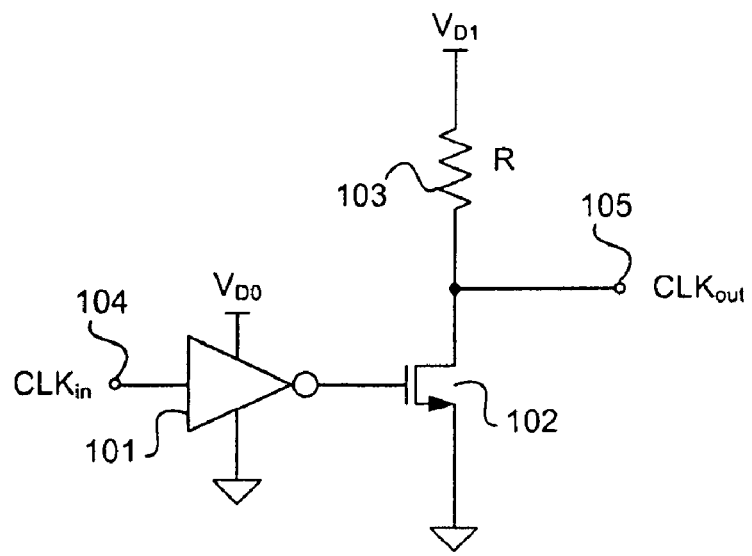
FIG. 1 illustrates a first prior art CMOS level shifter circuit.
Figure 2:
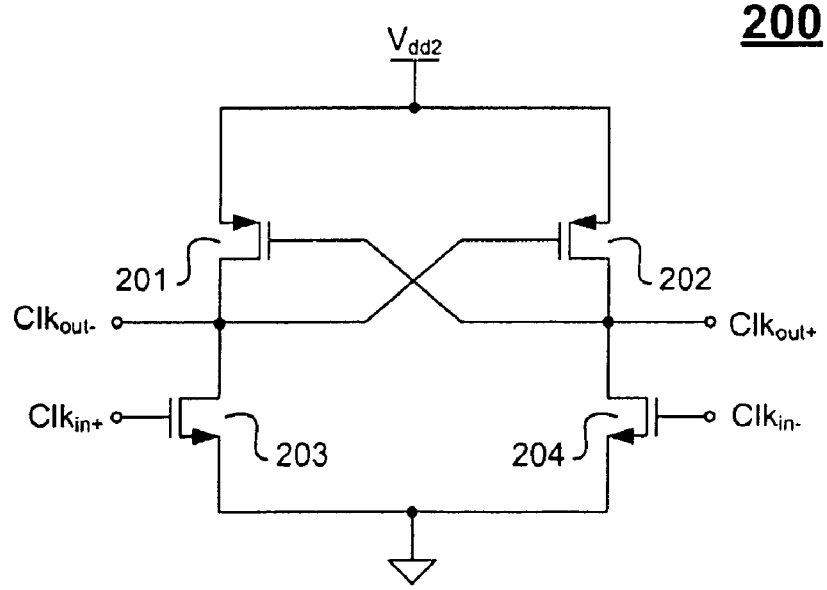
FIG. 2 illustrates a second prior art CMOS level shifter circuit.
Figure 3A:
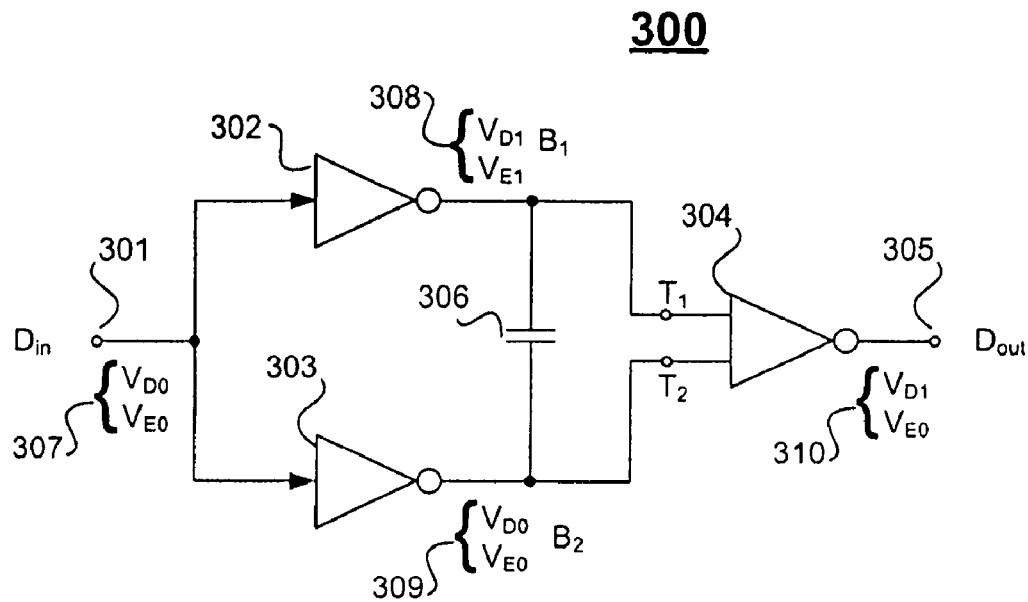
FIG. 3A illustrates a level shifter circuit according to one embodiment of the invention.

FIG. 3A illustrates a level shifter circuit 300 according to one embodiment of the invention. Level shifter circuit 300 shifts a high rail $V_{D0}$ of an input signal $D_{in}$ to a higher rail $V_{D1}$ of a buffer output signal $D_{out}$ such that the buffer output signal $D_{out}$ maintains transition timing relationships of input signal $D_{in}$. A transition timing relationship includes timing periods between different rising and falling transitions of a signal. For example, a period of a signal, a pulse width of a signal, and a duty cycle of a signal may all be part of a transition timing relationship.

Level shifter circuit 300 includes buffers 302-304, and a capacitor 306. Buffers 302 and 303 receive a digital input signal $D_{in}$ at an input terminal 301. Input signal $D_{in}$ has voltage rails 307 (i.e. $V_{D0}$ and $V_{E0}$). Buffer 302 provides a buffer output signal $B_1$ having voltage rails 308 (i.e. $V_{D1}$ and $V_{E1}$). Buffer 303 provides a buffer output signal $B_2$ having voltage rails 309 (i.e. $V_{D0}$ and $V_{E0}$). Buffer 304 receives buffer output signal $B_1$ on an input terminal $T_1$ and receives buffer output signal $B_2$ on an input terminal $T_2$. Buffer 304 provides buffer output signal $D_{out}$ on output terminal 305. Signal $D_{out}$ has voltage rails 310 (i.e. $V_{D1}$ and $V_{E0}$). Voltage rails 310 typically have a range greater than both a range of voltage rails 308 (i.e. $(V_{D1}-V_{E0})>(V_{D1}-V_{E1})$) and a range of voltage rails 309 (i.e. $(V_{D1}-V_{E0})>(V_{D0}-V_{E0})$) such that input signal $D_{in}$ having voltage rails 307 is level shifted to output signal $D_{out}$ having voltage rails 310. In one exemplary embodiment, $V_{D0}=2.0V, V_{E0}=0V, V_{D1}=5V, V_{E1}=3.0V$, and $V_{thresholdT1}$ (i.e. the threshold voltage of a transistor within buffer 304 coupled to terminal T1, not shown in FIG. 3A but shown in FIG. 4)=4.0V. $V_{E1}$ is 1V below threshold $V_{thresholdT1}$. $V_{thresholdT2}$ (the threshold voltage of a transistor within buffer 304 coupled to terminal T2, not shown in FIG. 3A but shown in FIG. 4) is between $V_{E0}$ and $V_{D0}$ (e.g. 1.0 V, for example).

In a 0.18 um process, the threshold voltage for a low voltage transistor (1.8V) is approximately 0.5V and the threshold voltage for the high voltage transistor (3.3V) is approximately 0.6V. In different processes the threshold voltage will be different. For example, in a 0.35 um process, the threshold voltage is normally about 0.7 for the high voltage transistor (5V). In one example design, $V_{D0}=1.8V, V_{E0}=0V, V_{D1}=3.3V$, and $V_{E1}=1.5V$.

When input signal $D_{in}$ is at high voltage $V_{D0}$ (in this example, 2.0V), buffer output signal $B_1$ is at low voltage $V_{E1}$ (3V), buffer output signal $B_2$ is at low voltage $V_{E0}$ (0V), and buffer output signal $D_{out}$ is at high voltage $V_{D1}$ (5V). When input signal $D_{in}$ changes state to low voltage $V_{E0}$ (i.e. 0V), buffer output signal $B_2$ goes to high voltage $V_{D0}$ (2.0V) at approximately the same rate as the transition of input signal $D_{in}$. The output lead of buffer 303 is AC coupled to terminal $T_1$ via capacitor 306. Since the output impedance of buffer 302 under these circumstances exceeds the output impedance of buffer 303, the transition on lead B2 caused by buffer 303 changes the voltage at terminal $T_1$ from 3V to 5V and therefore the voltage at terminal T1 passes threshold $V_{thresholdT1}$ of 4V. Buffer output signal $B_2$ at terminal $T_2$ and the AC coupled buffer output signal $B_2$ at terminal $T_1$ therefore change the state of buffer output signal $D_{out}$. The transition timing relationships of further transitions of states of buffer output signal $D_{out}$ match the transition timing relationships of the corresponding input signal $D_{in}$. (As used in this patent, "matching" does not necessarily require an exact matching). AC coupled buffer output signal $B_2$ provides transitions of states such that buffer output signal $D_{out}$ maintains transition timing relationships of input signal $D_{in}$.

The transition timing relationships include the duty cycle of input signal $D_{in}$ and the duty cycle of buffer output signal $D_{out}$. Also, the relationship of rising transitions and falling transitions of buffer output signal $D_{out}$ matches a relationship of corresponding rising and falling transitions of input signal $D_{in}$.

AC coupled buffer output signal $B_2$ drives an output impedance of buffer 302. Buffer 302 preferably has an output impedance that does not significantly alter the timing transition relationships of the rising AC coupled buffer output signal $B_2$. If the output impedance of buffer 302 excessively loads AC coupled buffer rising output signal $B_2$, the signal at input terminal $T_1$ may be delayed and the transfer of transition timing may be degraded.

Because output signal $B_2$ is AC coupled to terminal T1, it cannot hold the voltage level on terminal $T_1$ high indefinitely. In order to maintain the state of buffer output signal $D_{out}$, output signal $B_1$ preferably rises quickly enough to maintain the signal at input terminal $T_1$ above threshold $V_{thresholdT1}$ after the effect of the transition of signal $B_2$ on lead T1 recedes.

Figure 3B:
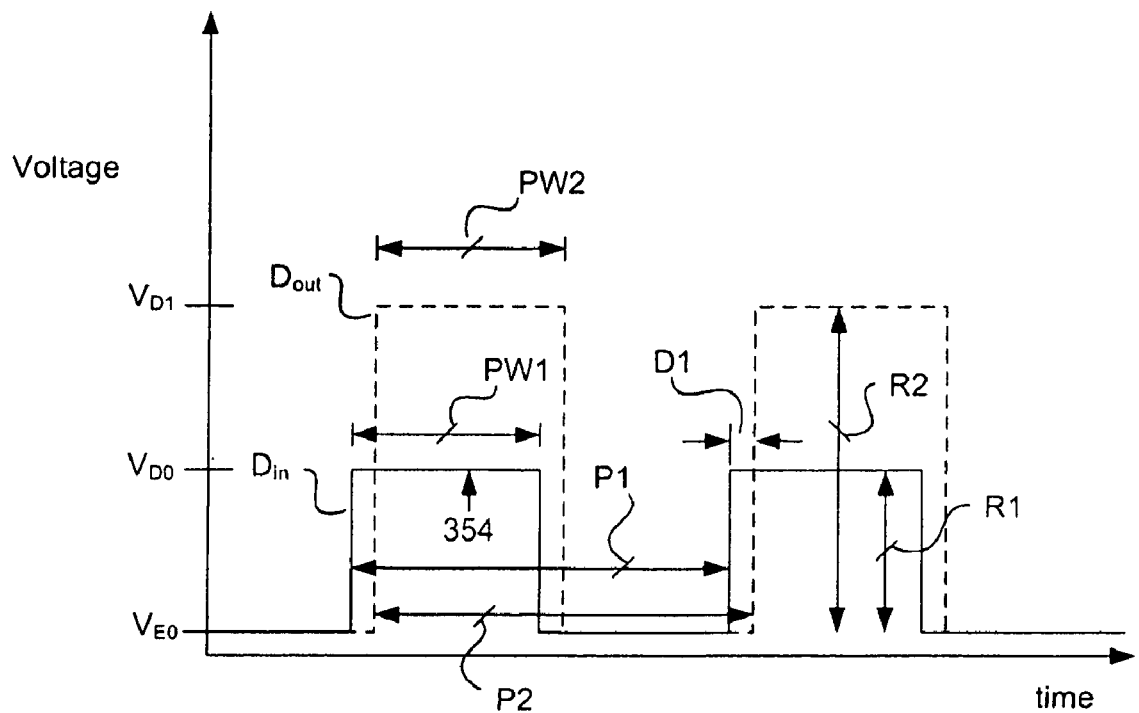
FIG. 3B illustrates waveforms associated with the level shifter circuit of FIG. 3A.

FIG. 3B illustrates waveforms associated with the input signal $D_{in}$ and buffer output signal $D_{out}$. As seen in FIG. 3B, input signal $D_{in}$ has high rail voltage $V_{D0}$ and a low rail voltage $V_{E0}$. Rising transition to rising transition of input signal $D_{in}$ defines a period P1. Input signal $D_{in}$ includes a pulse width PW1. Range R1 is the voltage difference traveled by input signal $D_{in}$.

There is a delay D1 between the input signal $D_{in}$ and buffer output signal $D_{out}$ due to propagation delays associated with the circuitry of level shifter circuit 300. Buffer output signal $D_{out}$ has high rail voltage $V_{D1}$ and low rail voltage $V_{E0}$. Rising transition to rising transition of buffer output signal $D_{out}$ defines a period P2. Buffer output signal $D_{out}$ includes a pulse width PW2. Range R2 is the voltage difference traveled by buffer output signal $D_{out}$.

Rail voltage $V_{D0}$ of input signal $D_{in}$ is level shifted to rail voltage $V_{D1}$ of buffer output signal $V_{out}$. Period P1 and pulse width PW1 of input signal $D_{in}$ match period P2 and pulse width PW2 of buffer output signal $D_{out}$. The duty cycle of input signal $D_{in}$, therefore matches the duty cycle of buffer output signal $D_{out}$. FIG. 3B shows that transition timing relationships of buffer output signal $D_{out}$ matches the transition timing relationships of input signal $D_{in}$. (As mentioned above, matching as used herein is not necessarily an exact matching.)

Figure 4A:
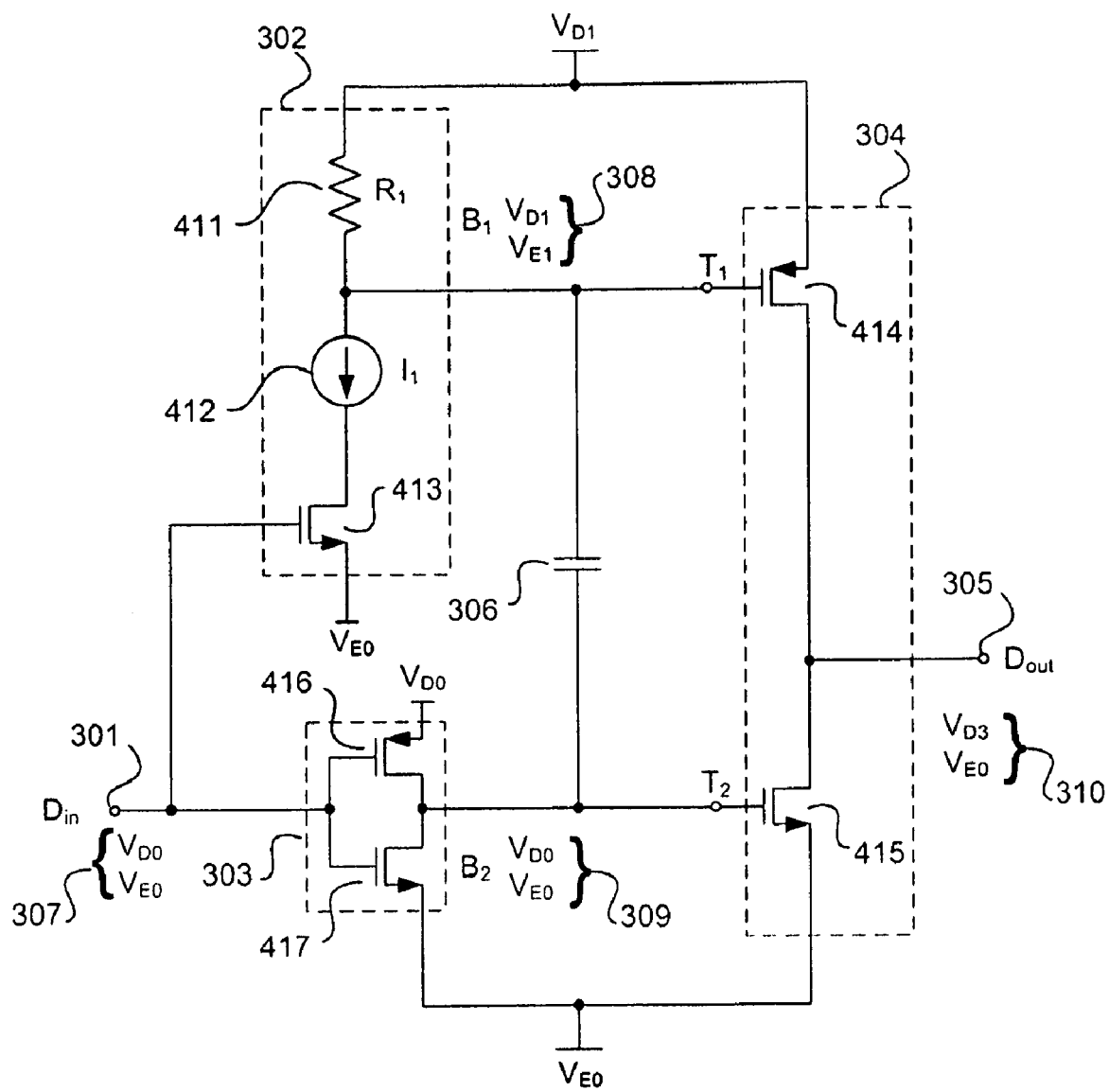
FIG. 4A illustrates in detail an example of a level shifter circuit according to the embodiment of FIG. 3A.

FIG. 4A illustrates in detail an example of an embodiment in accordance with FIG. 3A. Buffer 302 of FIG. 4 drives buffer output signal $B_1$. Buffer 302 of FIG. 4 includes a resistor 411, a current source 412, and a transistor 413. One terminal of resistor 411 is coupled to reference voltage $V_{D1}$ and the other terminal of resistor 411 is coupled to input terminal $T_1$. Input terminal $T_1$ is also coupled to one terminal of capacitor 306 and one terminal of current source 412. The other terminal of current source 412 is coupled to one terminal of transistor 412. The other terminal of transistor 412 is coupled to reference voltage $V_{E0}$. A control terminal of transistor 413 is coupled to input terminal 301.

Voltage rails 308 of buffer output signal $B_1$ cooperate with AC coupled buffer output signal $B_2$ to allow AC coupled signal B2 to cross the threshold of transistor 414 to turn transistor 414 on and off. In one example, $V_{D0}=V_{E1}=3.0V$, $V_{E0}=0V$, $V_{D1}=5V$, and $V_{thresholdT1}=4.0V$. $V_{thresholdT1}$ is the threshold voltage of transistor 414. $V_{E1}$ suffices to keep transistor 414 on but also allows a rising transition of AC coupled buffer output signal $B_2$ to turn off transistor 414 in response to a falling transition of signal $D_{in}$. In one example of this embodiment, $$V_{D1}-V_{E1}=(I_1*R_1)=V_{D0}-V_{E0}=2.0V$$

$$V_{D1}=5.0V$$

$$V_{E1}=V_{D1}-2=5.0V$$

$$V_{D1}-V_{E1}=5V-3V=2V.$$

As can be seen from the foregoing, current $I_1$ and resistance $R_1$ are selected to establish voltage $V_{E1}$ at a desired value (in this example, 3.0 V). Assuming the signal $D_{in}$ is running at 50 MHz and capacitor 306 is represented as $C_{306}$, the following equation follows.

$$R_1 * C_{306} = \frac{1}{2\pi f} = \frac{1}{2*3.14*50\text{MHz}} = 3\text{ns}$$

The capacitor $C_{306}$ may occupy less area, and a value of 0.6 pF may be chosen for this case. From the equation shown above, minimum $R_1$ follows as shown below.

$$R_1(\min) = \frac{3\text{ns}}{0.6\text{pF}} = 5 kohms$$

To achieve a safe margin, $R_1$ may be chosen as follows.

$$R_1 = 10*R\min = 506 \text{ kohm}$$

Therefore, $I_1=(V_{D1}-V_{E1})/R_1=40$ uA. For a higher frequency signal $D_{in}$, smaller values of capacitance $C_{306}$ may be used.

Figure 4B:
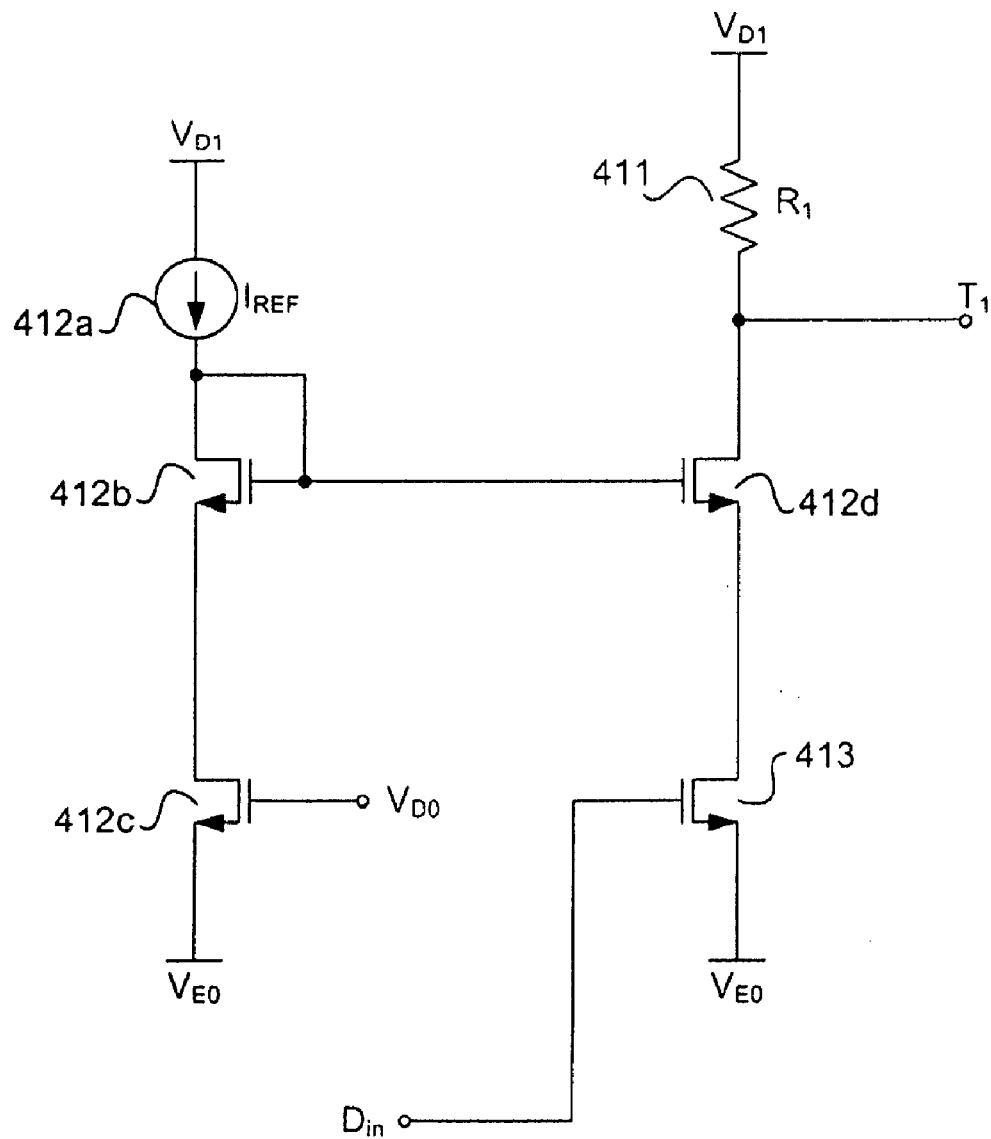
FIG. 4B illustrates a current source for use in the embodiment of FIG. 4A.

FIG. 4B illustrates a current source for use in the embodiment of FIG. 4A. Current source 302 includes a reference current source 412a and an NMOS current mirror comprising transistors 412b-412d. Reference current source 412a is coupled to transistor 412b which is coupled as a diode. Reference current source 412a is also coupled to a control terminal of transistor 412d such that transistor 412d delivers current $I_1$ to resistor $R_1$ (412) when transistor 413 is turned on. The current $I_1$ generates a voltage as described above at terminal T1.

Transistor 412c is coupled to bias transistor 412b. A control terminal of transistor 412c receives voltage $V_{D0}$. When input signal Din turns on transistor 413 by providing voltage $V_{D0}$ to a control terminal of transistor 413, the current mirror provides current $I_1$. In this embodiment transistor 412b matches transistor 412d and transistor 412c matches transistor 413. In this case I1=Iref. However changing the ratio of the dimensions of the transistors by one skilled in the art will result in currents that are a fraction or a multiple of reference current Iref. A PMOS current mirror may be implemented in a similar manner to generate $I_2$ in FIG. 6.

Figure 5A:
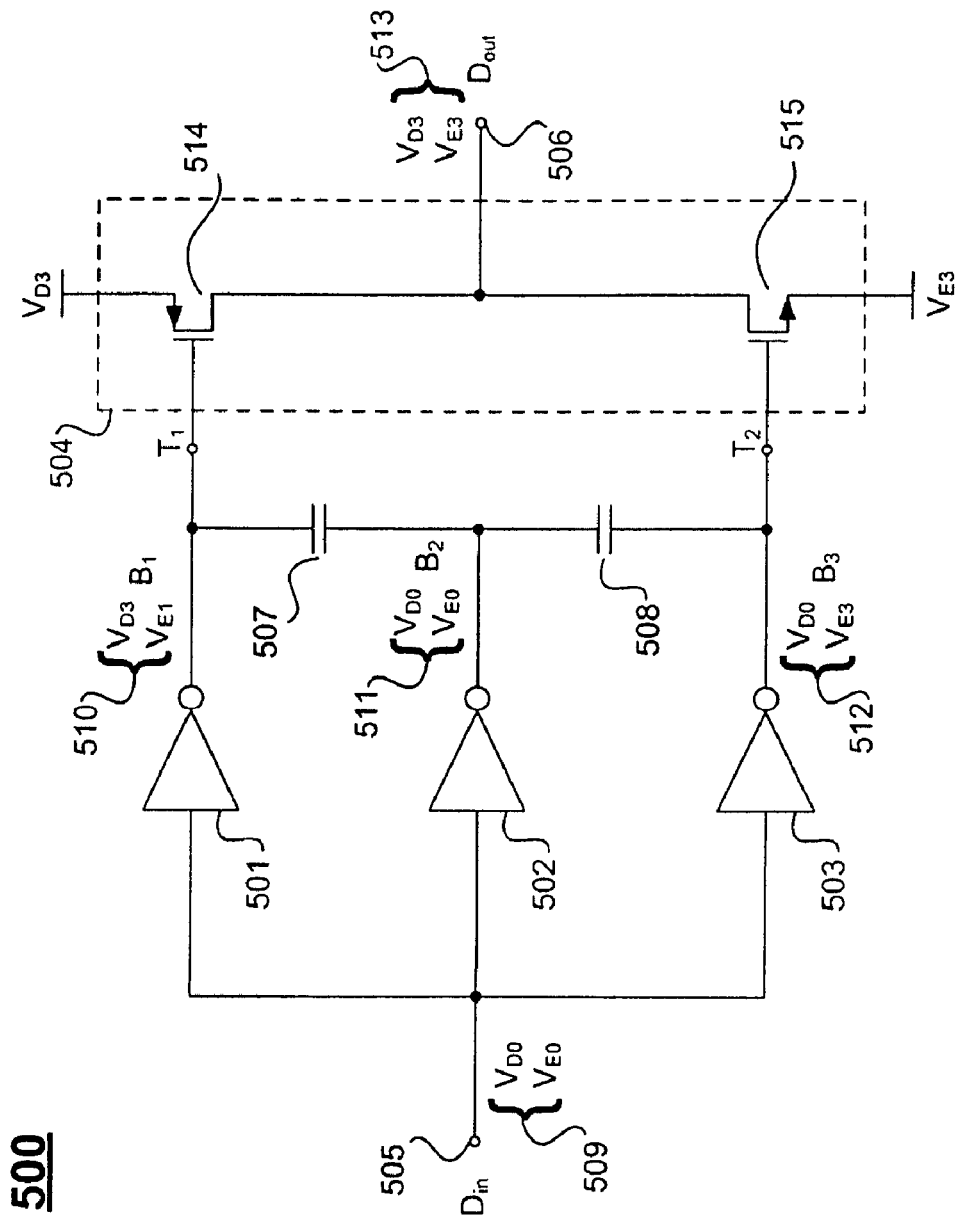
FIG. 5A illustrates a level shifter circuit according to one embodiment of the invention.

FIG. 5A illustrates a level shifter circuit 500 according to another embodiment of the invention for shifting both the high voltage rail $V_{D0}$ and the low voltage rail $V_{E0}$ to voltages $V_{D3}$ and $V_{E3}$, respectively. Level shifter circuit 500 includes buffers 501-504 and capacitors 507-508. Level shifter circuit 500 is similar to level shifter circuit 300 of FIG. 3. Buffers 501-503 receive input signal $D_{in}$. Buffer 502 provides a buffer output signal $B_2$. Capacitor 507 AC couples signal $B_2$ to input terminal $T_1$ of buffer 504. Capacitor 508 AC couples signal $B_2$ to input terminal $T_2$ of buffer 504. The first and second AC coupled signals contribute to the transitioning of buffer output signal $D_{out}$. Buffer 502 provides a buffer output signal $B_1$ to maintain the state of transistor 514 when the effect to AC coupled signal $B_2$ decays at input terminal $T_1$. In a similar manner, buffer 503 provides a buffer output signal $B_3$ to maintain the state of transistor 515 when the effect of AC coupled buffer output signal $B_2$ decays at input terminal $T_2$. Maintaining the state of transistors 514 and 515 maintains the state of buffer output signal $D_{out}$.

Level shifter circuit 500 shifts high rail voltage $V_{D0}$ of input signal $D_{in}$ to a higher rail voltage $V_{D3}$ of a buffer output signal $D_{out}$ and shifts low rail voltage $V_{E0}$ of input signal $D_{in}$ to a lower rail voltage $V_{E3}$ of buffer output signal $D_{out}$. The shifting of the high rail voltage $V_{D0}$ and low rail voltage $V_{E0}$ is accomplished while buffer output signal $D_{out}$ maintains transitioning timing relationships of input signal $D_{in}$.

Figure 5B:
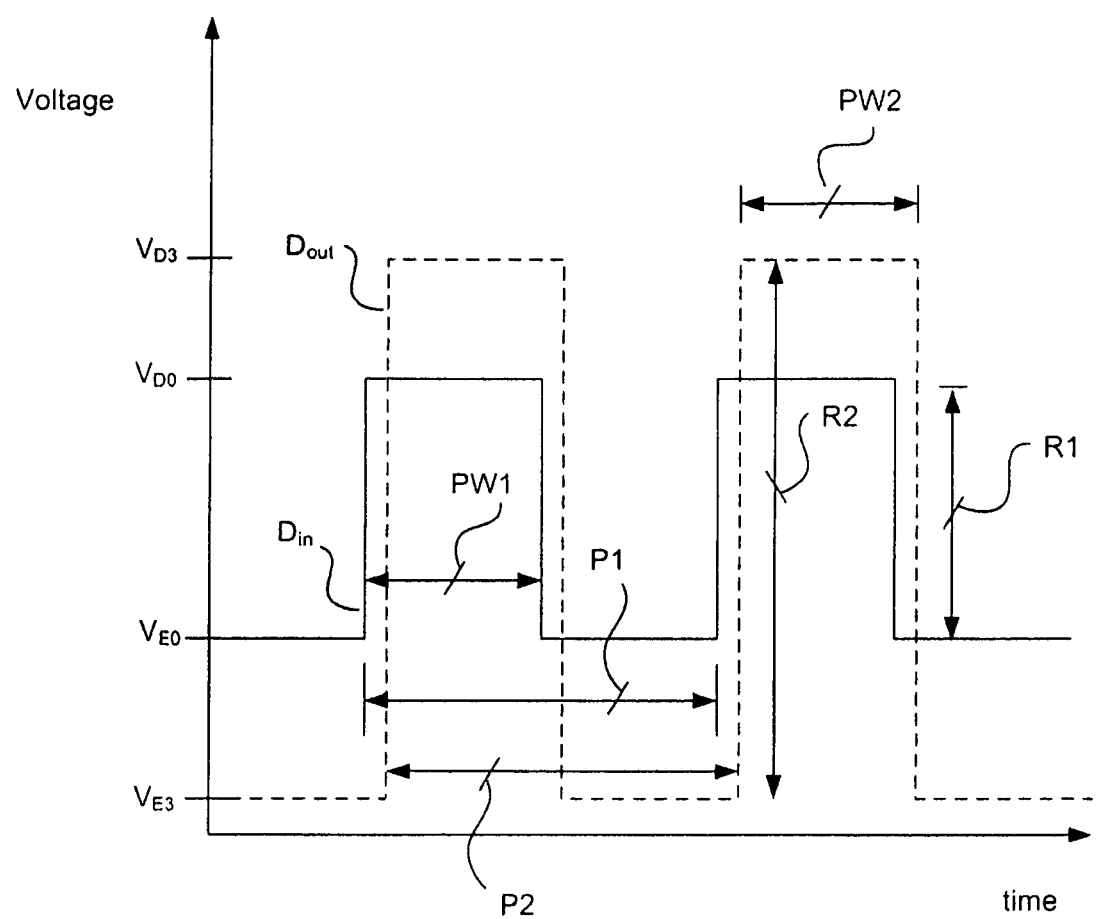
FIG. 5B illustrates waveforms associated with the level shifter circuit of FIG. 5A.

FIG. 5B illustrates exemplary waveforms of input signal $D_{in}$ and output signal $D_{out}$. Signals $D_{in}$ and $D_{out}$ are illustrated as square waves, but in other embodiments they can have any duty cycle. Also these signals do not need to be repetitive waveforms. For example, the waveforms may be a stream of digital data.

Input signal $D_{in}$ and output signal $D_{out}$ include matching transition timing relationships. Input signal $D_{in}$ includes a low level $V_{E0}$, a high level $V_{D0}$, a period P3, a pulse width PW3, and a voltage range R3. Buffer output $D_{out}$ includes a low level $V_{E3}$, a high level voltage $V_{D3}$, a period P4, a pulse width PW4, and a voltage range R4. Period P3 and pulse width PW3 match period P4 and pulse width P4, respectively. Also, the duty cycle of signal $D_{in}$ matches the duty cycle of signal $D_{out}$.

Although buffer output signal $D_{out}$ is delayed relative to input signal $D_{in}$, the transition timing relationships of signal $D_{out}$ match the transition timing relationships signal $D_{in}$. For example, period P4 matches period P3 and pulse width PW4 matches pulse width PW3. Input signal $D_{in}$ has been level shifted to voltage range R4 from voltage range R3. Voltage level $V_{E3}$ is less than voltage level $V_{E0}$, voltage $V_{D3}$ is greater than voltage $V_{D0}$ and range R4 exceeds range R3.

Figure 6:
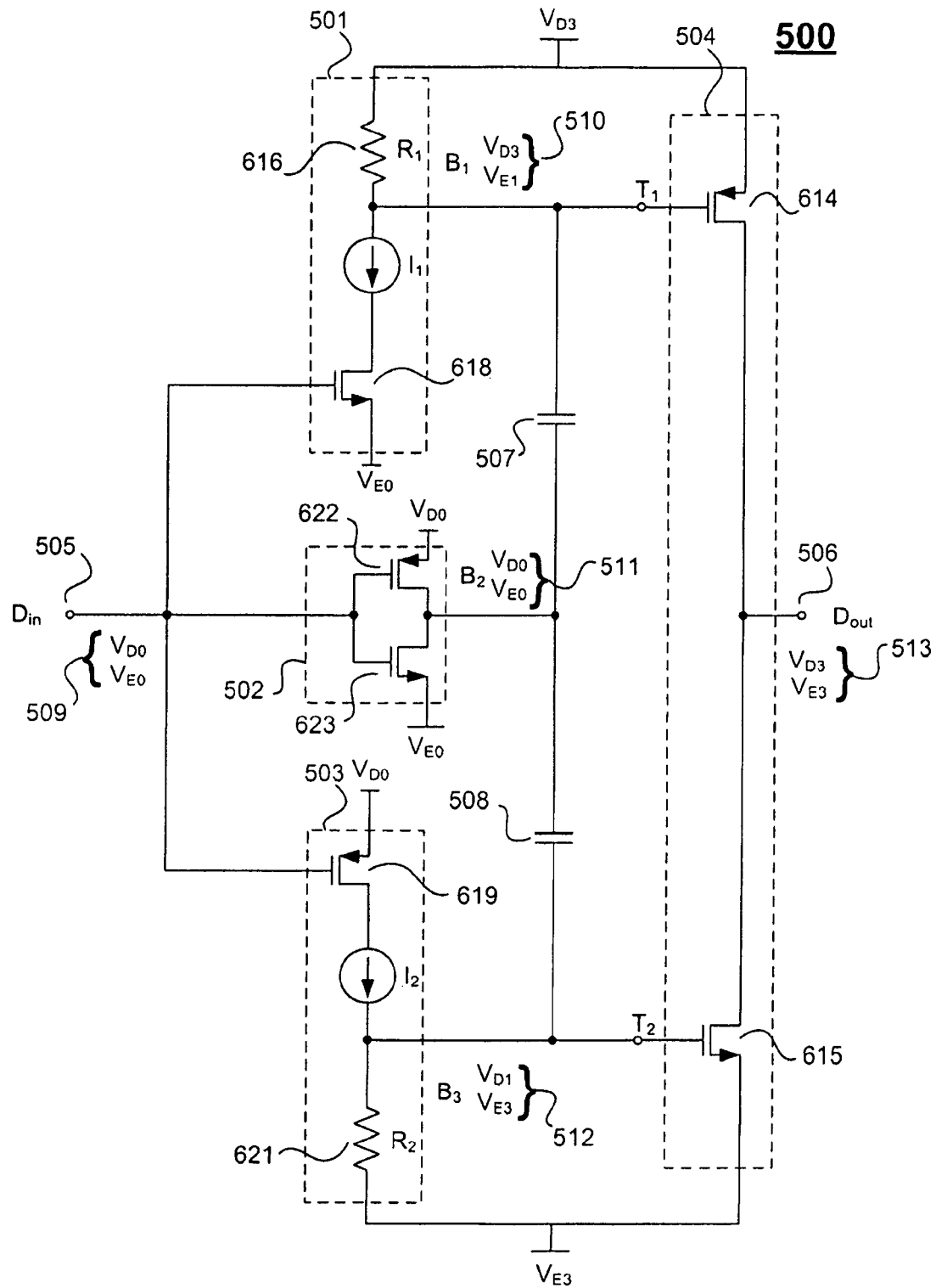
FIG. 6 illustrates in detail an example of a level shifter circuit according to the embodiment of FIG. 3A.

FIG. 6 illustrates in detail an embodiment in accordance with FIG. 5A, discussed above. As can be seen, buffer 501 comprises the same components, and operates in a manner similar to, buffer 302 of FIG. 4. Buffer 502 comprises the same components, and operates in a manner similar to buffer 303. Buffer 503 is similar to buffer 501, except that it includes a P channel transistor 619 instead of an N channel transistor 616. Also, resistor 621 is coupled to low reference voltage $V_{E3}$ instead of high voltage lead $V_{D3}$. Below are example values for level shifter circuit 500 of FIG. 6. Signal Din has a frequency of 50 MHz for this example.

$R_1=R_2=50$ Kohm, $C_{507}=C_{508}=0.6$ pf, $I_1=I_2=40$ uA.

$V_{D0}=2V$, $V_{E0}=0V$, $V_{D3}=3V$, $V_{E3}=-3V$

The level shifter circuits described above and other equivalent embodiments may be implemented using CMOS technology or other IC technology suitable for implementing embodiments of the present invention. For example, a high speed process such as processes utilizing a GaAs process can be used to implement embodiments of this invention as well. Alternatively, other semiconductor materials such as Si can be used. The level shifter circuits and methods may be integrated into a system fabricated as an IC. In addition, other components may be added to the circuit without departing from the invention.

Although the buffers discussed above perform inverting functions, in other embodiments, the buffers can perform logic functions (e.g. AND, NAND, NOR, OR) and non-inverting buffering as well. Signals $D_{in}$ and $D_{out}$ can be clock, data, instructions or other types of signals.

In one embodiment, instead of just shifting high voltage $V_{D0}$ to $V_{D1}$ as shown in FIG. 3, in another embodiment, only low voltage $V_{E0}$ is shifted to voltage $V_{E1}$ (e.g. using circuitry similar to buffer 503). Also, in one embodiment, buffers 303 and 502 need not operate off of voltages $V_{E0}$ and $V_{D0}$. Further, buffer 304 can use a voltage other than voltage $V_{E0}$. For example, buffer 304 can use a voltage slightly higher than voltage $V_{E0}$. Accordingly, all such modifications come within the invention.

What is claimed is:

1. A circuit comprising:
   a first buffer receiving an input signal, said first buffer providing a first buffer output signal on a first output lead;
   a second buffer receiving said input signal, said second buffer providing a second buffer output signal on a second output lead; and
   an output buffer having a first input lead coupled to said first output lead and AC coupled to said second output lead, said AC coupling communicating timing information from said second buffer to said output buffer, said first buffer applying sufficient voltage to control said first input lead to said output buffer under DC conditions.

2. The circuit of claim 1 wherein said first buffer has a higher output impedance than said second buffer so that changes in state of said second buffer output signal are communicated to said first input lead of said output buffer.

3. The circuit of claim 1 wherein said output buffer comprises a first switch having a control lead coupled to said first input lead of said output buffer and a second switch having a control lead coupled to said second output lead, said first and second switches being coupled in series across a voltage supply, said output buffer having an output lead coupled to a node between said switches.

4. The circuit of claim 1 further comprising a fourth buffer receiving said input signal and providing a fourth buffer output signal to a second input lead of said output buffer, wherein said output buffer comprises a first switch having a control lead coupled to said first input lead of said output buffer and a second switch having a control lead coupled to said second output lead, said first and second switches being coupled in series across a voltage supply, said output buffer having an output lead coupled to a node between said switches.

5. The circuit of claim 1 wherein said input signal has a set of input voltage rail values, said output buffer provides an output signal having a set of output voltage rail values having a greater voltage swing than the voltage swing of said input voltage rail values, said first buffer ensuring that the signal on the input lead of said output buffer achieves a sufficient voltage under DC conditions to properly operate said output buffer, said second buffer ensuring that the input lead of said output buffer achieves a sufficient voltage under AC conditions to properly operate said output buffer.

6. A circuit comprising:
   a first buffer receiving an input signal, said first buffer providing a first buffer output signal having first voltage rail values;
   a second buffer receiving said input signal, said second buffer providing a second buffer output signal having second voltage rail values; and
   a third buffer coupled to receive said first output signal on a first input terminal and coupled to receive said second buffer output signal on a second input terminal, said third buffer providing a third buffer output signal having third voltage rail values,
   wherein said third buffer voltage rails have a range greater than both a range of said first voltage rail values and a range of said second voltage rail values, and
   wherein said second buffer output signal provides signal transitions to the first and second input terminals of said third buffer such that said third buffer maintains transition timing relationships of said input signal.

7. The circuit of claim 6 wherein the transition timing relationship includes a duty cycle of said input cycle.

8. The circuit of claim 6 further comprising a capacitor coupled between said first input terminal of said third buffer and said output terminal of said second buffer, said capacitor AC coupling said second buffer output signal to said first input terminal of said third buffer.

9. The circuit of claim 8 wherein said range of said first voltage rails allows said second voltage rail values of said second buffer output signal to contribute to a change of state of said third buffer output signal according to said transition timing relationship.

10. The circuit of claim 8 wherein said second buffer drives an output impedance of said first buffer to change a state of said third buffer output signal,
    wherein said first buffer maintains said state of said third buffer output signal when said AC coupled signal decays.

11. The circuit of claim 6 further comprising:
    a fourth buffer receiving said input signal, said fourth buffer providing a fourth buffer output signal having a fourth voltage rail values to said second input lead of said third buffer, said third buffer being AC coupled to said second input lead of said third buffer,
    wherein said third buffer voltage rails have a range greater than a range of said fourth voltage rail values.

12. The circuit of claim 11 further comprising:
    a first capacitor coupled between said first input terminal of said third buffer and an output terminal of said second buffer; and
    a second capacitor coupled between said second input terminal of said third buffer and said output terminal of said second buffer,
    wherein said first capacitor AC couples said second buffer output signal to said first input terminal of said third buffer, and wherein said second capacitor AC couples said second buffer output signal to said second input terminal of said third buffer.

13. The circuit of claim 12 wherein the range of said first voltage rail values allows said second voltage rail values of the second buffer output signal to contribute to a change of state of the third buffer output signal according to the transition timing relationship, and wherein the range of said fourth voltage rail values allows said second voltage rail values of the second buffer output signal to contribute to a change of state of the third buffer output signal according to the transition timing relationship.

14. The circuit of claim 12 wherein said second buffer drives an output impedance of said first and fourth buffers to change a state of said third buffer output signal, and wherein said first and fourth buffers maintain said state of said third buffer output signal when said AC coupled signal decays.

15. The circuit of claim 11 wherein said third buffer includes a high side switch and a low side switch, wherein the high side switch has a first terminal coupled to a first reference voltage, a second terminal coupled to an output terminal, and a control terminal coupled to said first input terminal of said third buffer, wherein the low side switch has a first terminal coupled to said output terminal, a second terminal coupled to a second reference voltage, and a control terminal coupled to said second input terminal of said third buffer, and wherein the first and second reference voltages provide said third voltage rail values.

16. An integrated circuit comprising the circuit of claim 1.

17. A method comprising:
passing an input signal through a first buffer to generate a first output signal;
passing said input signal through a second buffer to generate a second output signal;
providing said first output signal to an input lead of an output buffer;
communicating timing information from said second buffer output signal to said input lead of said second buffer via AC coupling; and
wherein said first buffer output signal has sufficient voltage to control said first input lead of said output buffer under DC conditions.

18. The method of claim 17 wherein said first buffer output signal does not interfere with the communication of changes of state of said second output buffer signal to said first input lead of said output buffer.

19. The method of claim 17 further comprising:
switching a first switch within said output buffer in response to a signal on said input lead of said output buffer; and
switching a second switch within said output buffer in response to said second output signal,
wherein said switching said first switch includes coupling a first reference voltage to an output terminal of said output buffer, and
wherein said switching said second switch includes coupling a second reference voltage to said output terminal of said output buffer.

20. The method of claim 17 further comprising:
passing said input signal through a third buffer to generate a third output signal therefrom;
coupling said third output signal to a second input lead of said output buffer;
switching a first switch within said output buffer in response to a first signal on said input lead of said output buffer; and
switching a second switch within said output buffer in response to a second signal on said second input lead of said output buffer,
wherein said switching said first switch couples a first reference voltage to an output terminal of said output buffer, and
wherein said switching said second switch couples a second reference voltage to an output terminal of said output buffer.

21. The method of claim 17 wherein said input signal has a set of input voltage rail values, said output buffer provides an output signal having a set of output voltage rail values having a greater voltage swing than the voltage swing of said input voltage rail values, said first buffer output signal having a sufficient voltage under DC conditions to properly operate said output buffer, said second buffer output signal having a sufficient voltage under AC conditions to properly operate said output buffer.

* * * * *